(12) United States Patent
Kagohashi

(10) Patent No.: US 12,414,231 B2
(45) Date of Patent: Sep. 9, 2025

(54) PRINTED WIRING BOARD

(71) Applicant: IBIDEN CO., LTD., Gifu (JP)

(72) Inventor: Susumu Kagohashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 156 days.

(21) Appl. No.: 18/191,020

(22) Filed: Mar. 28, 2023

(65) Prior Publication Data

US 2023/0319986 A1 Oct. 5, 2023

(30) Foreign Application Priority Data

Mar. 29, 2022 (JP) ................................. 2022-052978
Jan. 23, 2023 (JP) ................................. 2023-007796

(51) Int. Cl.
*H05K 1/02* (2006.01)
*H05K 1/11* (2006.01)

(52) U.S. Cl.
CPC ........... *H05K 1/0298* (2013.01); *H05K 1/113* (2013.01); *H05K 2201/0338* (2013.01); *H05K 2201/0347* (2013.01); *H05K 2201/0352* (2013.01); *H05K 2201/09563* (2013.01); *H05K 2201/09736* (2013.01); *H05K 2201/09827* (2013.01)

(58) Field of Classification Search
CPC ...... H05K 1/0298; H05K 3/16; H05K 3/4679; H05K 2203/0723; H05K 3/0094; H05K 3/143; H05K 3/24; H05K 2201/0338; H05K 2201/0347; H05K 2201/0352; H05K 2201/09509; H05K 2201/09563; H05K 2201/09736; H05K 2201/09827; H05K 2203/0557; H05K 2203/1438; H05K 2203/1476; H05K 2203/0716; H05K 3/188; H05K 3/42–428; H05K 3/4611; H05K 1/112–115
See application file for complete search history.

(56) References Cited

U.S. PATENT DOCUMENTS

| 8,878,077 | B2 * | 11/2014 | Ito ........................ H05K 3/4652 |
| | | | 174/257 |
| 2017/0245365 | A1 * | 8/2017 | Ishihara ................. H05K 1/115 |
| 2021/0134584 | A1 * | 5/2021 | Chiu .................. H01L 21/76898 |
| 2024/0145374 | A1 * | 5/2024 | Nirengi ................ H05K 3/4658 |
| 2024/0147617 | A1 * | 5/2024 | Nirengi .................... H05K 3/46 |

FOREIGN PATENT DOCUMENTS

JP 2000-124602 A 4/2000

* cited by examiner

*Primary Examiner* — Steven T Sawyer
(74) *Attorney, Agent, or Firm* — Finnegan, Henderson, Farabow, Garrett & Dunner, LLP

(57) ABSTRACT

A printed wiring board includes a first conductor layer, a resin insulating layer formed on the first conductor layer, a second conductor layer formed on a surface of the insulating layer, and a via conductor formed in an opening formed in the insulating layer such that the via conductor is connecting the first and second conductor layers. The second conductor layer and via conductor include a seed layer and an electrolytic plating layer formed on the seed layer such that the seed layer has a first portion formed on the surface of the insulating layer, a second portion formed on an inner wall surface of the insulating layer in the opening, and a third portion formed on the first conductor layer exposed from the opening and that the first portion has a thickness that is greater than a thickness of the second portion and a thickness of the third portion.

20 Claims, 5 Drawing Sheets

PRINTED WIRING BOARD

CROSS-REFERENCE TO RELATED APPLICATIONS

The present application is based upon and claims the benefit of priority to Japanese Patent Applications No. 2022-052978, filed Mar. 29, 2022, and No. 2023-007796, filed Jan. 23, 2023. The entire contents of these applications are incorporated herein by reference.

BACKGROUND OF THE INVENTION

Field of the Invention

The present invention relates to a printed wiring board.

Description of Background Art

Japanese Patent Application Laid-Open Publication No. 2000-124602 describes a printed wiring board having a resin substrate, a resin insulating layer formed on the resin substrate, and a conductor circuit. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on a surface of the resin insulating layer, and a via conductor formed in an opening formed in the resin insulating layer such that the via conductor is connecting the first conductor layer and the second conductor layer. The second conductor layer and the via conductor include a seed layer and an electrolytic plating layer formed on the seed layer such that the seed layer has a first portion formed on the surface of the resin insulating layer, a second portion formed on an inner wall surface of the resin insulating layer in the opening, and a third portion formed on the first conductor layer exposed from the opening and that the first portion has a thickness that is greater than a thickness of the second portion and a thickness of the third portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
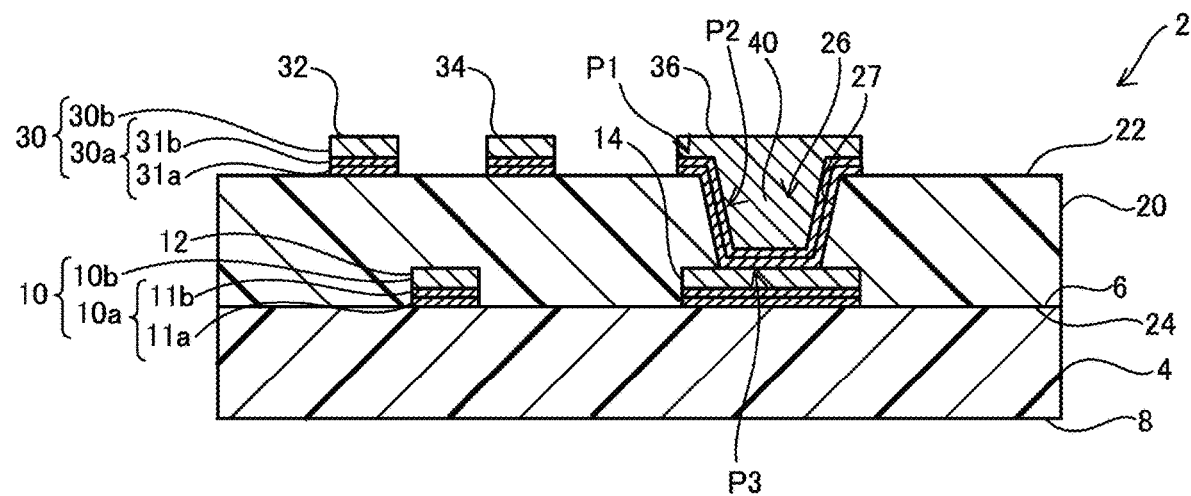
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
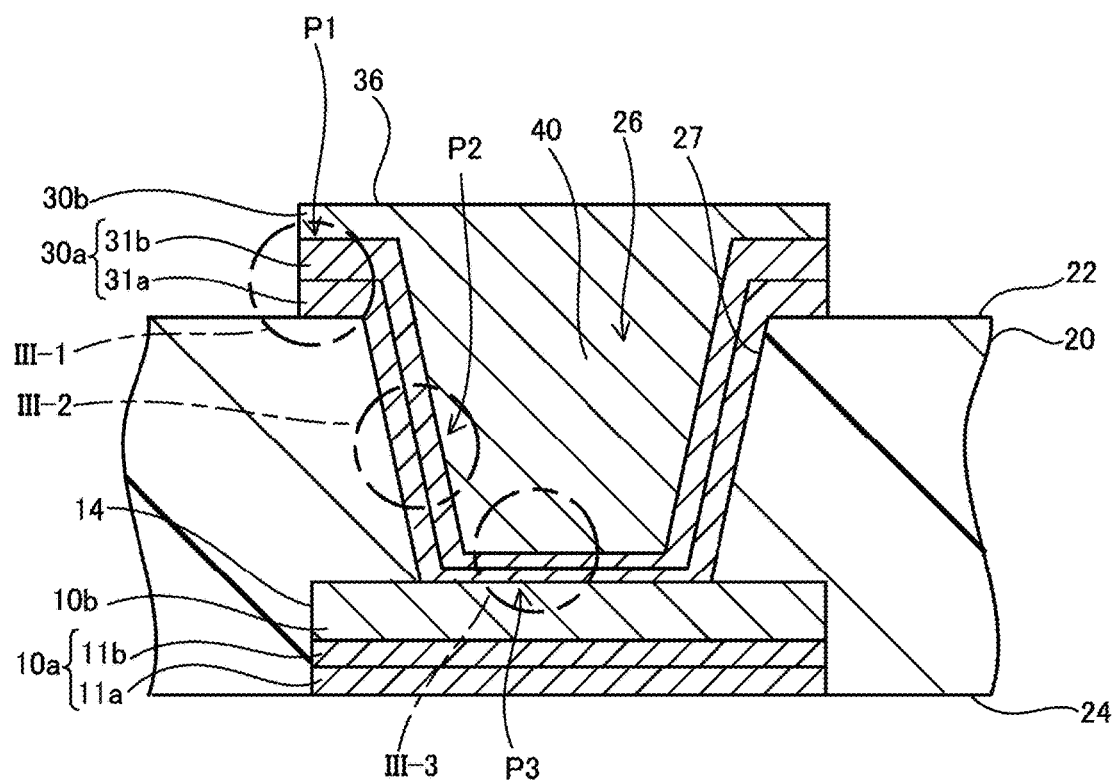
FIG. 2 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles or alumina particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10*a*) on the insulating layer 4 and an electrolytic plating layer (10*b*) on the seed layer (10*a*). The seed layer (10*a*) is formed by a first layer (11*a*) on the third surface 6 and a second layer (11*b*) on the first layer (11*a*). The first layer (11*a*) is formed of a copper alloy. The copper alloy has a copper content (wt %) of 90% or more. The second layer (11*b*) is formed of copper. The electrolytic plating layer (10*b*) is formed of copper. The first layer (11*a*) is in contact with the insulating layer 4.

The resin insulating layer 20 is formed on the third surface 6 of the insulating layer 4 and on the first conductor layer 10. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 has an opening 26 that expose the pad 14. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles.

The first surface 22 of the resin insulating layer 20 is formed mostly of the resin. A small amount of the inorganic particles are exposed from the first surface 22. No unevenness is formed on the first surface 22 of the resin insulating layer 20. The first surface 22 is not roughened. The first surface 22 is formed smooth.

The second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by a first layer (31a) on the first surface 22 and a second layer (31b) on the first layer (31a). The first layer (31a) is formed of a copper alloy. The copper alloy has a copper content (wt %) of 90% or more. The second layer (31b) is formed of copper. The electrolytic plating layer (30b) is formed of copper. The first layer (31a) is in contact with the first surface 22.

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (30a) and an electrolytic plating layer (30b) on the seed layer (30a). The seed layer (30a) forming the via conductor 40 and the seed layer (30a) forming the second conductor layer are the same. The seed layer (30a) forming the via conductor 40 is formed of a first layer (31a) covering an inner wall surface 27 of the opening 26 and an upper surface of the pad 14 exposed from the opening 26, and a second layer (31b) on the first layer (31a). The first layer (31a) is in contact with the upper surface of the pad 14 and the inner wall surface 27.

Figure 3A:
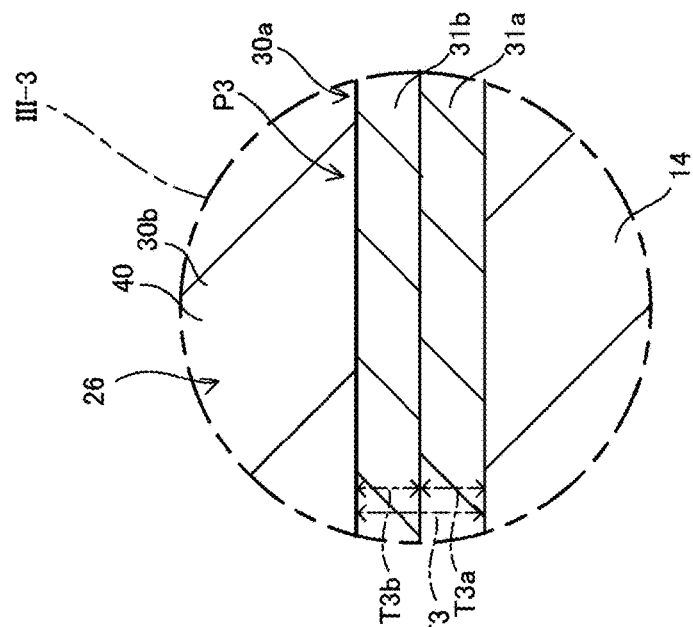
FIGS. 3A-3C are each an enlarged cross-sectional view schematically illustrating a part of a seed layer.
Figure 3B:
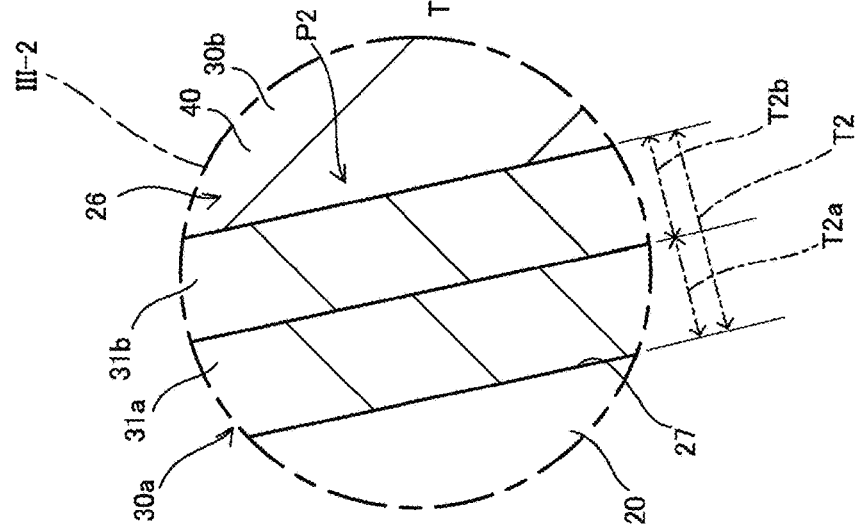
Figure 3C:
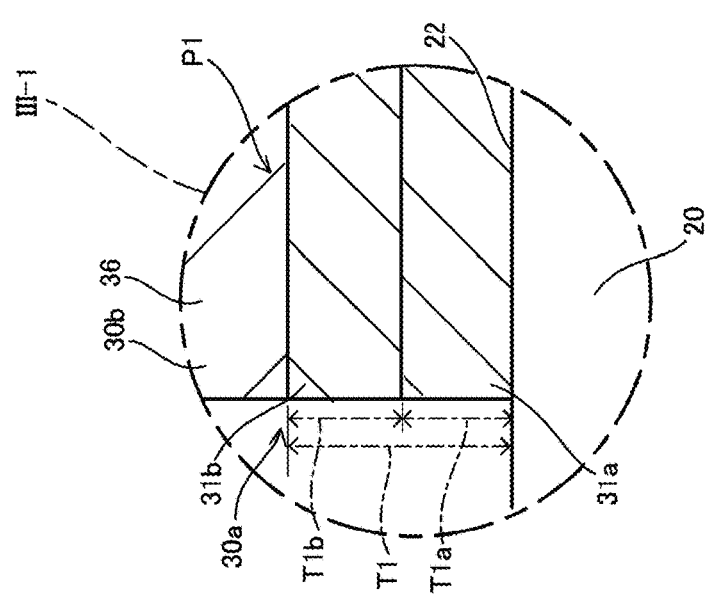

The seed layer (30a) has a first portion (P1) on the first surface 22, a second portion (P2) on the inner wall surface 27 of the opening 26, and a third portion (P3) on the pad 14 exposed from the opening 26. FIGS. 3A-3C are each an enlarged cross-sectional view illustrating a part of the seed layer (30a). FIG. 3A illustrates a portion (first portion (P1)) indicated by a symbol (III-1) in FIG. 2. FIG. 3B illustrates a portion (second portion (P2)) indicated by a symbol (III-2) in FIG. 2. FIG. 3C illustrates a portion (third portion (P3)) indicated by a symbol (III-3) in FIG. 2. As illustrated in FIGS. 3A-3C, a thickness (T1) of the first portion (P1) is larger than a thickness (T2) of the second portion (P2) and a thickness (T3) of the third portion (P3). Further, the thickness (T2) of the second portion (P2) is larger than the thickness (T3) of the third portion (P3).

When the seed layer (30a) is formed of multiple layers, the thickness (T1), the thickness (T2) and the thickness (T3) are each a total thickness of the layers.

A thickness (T1a) of the first portion (P1) of the first layer (31a) is larger than a thickness (T2a) of the second portion (P2) of the first layer (31a) and a thickness (T3a) of the third portion (P3) of the first layer (31a). Further, the thickness (T2a) of the second portion (P2) of the first layer (31a) is larger than the thickness (T3a) of the third portion (P3) of the first layer (31a).

Thicknesses of the other layers have similar relationships to those of the thicknesses of the first layer (31a). Therefore, when the seed layer (30a) is formed of two layers, a thickness (T1b) of the first portion (P1) of the second layer (31b) is larger than a thickness (T2b) of the second portion (P2) of the second layer (31b) and a thickness (T3b) of the third portion (P3) of the second layer (31b). Further, the thickness (T2b) of the second portion (P2) of the second layer (31b) is larger than the thickness (T3b) of the third portion (P3) of the second layer (31b).

A thickness of the second layer (31b) is larger than a thickness of the first layer (31a). The thickness (T1b) is larger than the thickness (T1a). The thickness (T2b) is larger than the thickness (T2a). The thickness (T3b) is larger than the thickness (T3a).

The thickness (T1) of the first portion (P1) of the seed layer (30a) on the first surface 22 of the resin insulating layer 20 is 0.02 μm or more and 1.0 μm or less. The thickness (T1a) of the first portion (P1) of the first layer (31a) is 0.01 μm or more and 0.5 μm or less. The thickness (T1b) of the first portion (P1) of the second layer (31b) is 0.01 μm or more and 0.9 μm or less. When the thickness (T1) of the first portion (P1) of the seed layer (30a) is less than 0.02 for example, adhesion strength between the resin insulating layer 20 and the seed layer (30a) is low. When the thickness (T1) of the first portion (P1) exceeds 1.0 μm, since an etching amount of the seed layer increases, it becomes difficult to control a wiring width.

The thickness (T2) of the second portion (P2) of the seed layer (30a) on the inner wall surface 27 of the opening 26 is 0.006 μm or more and 0.6 μm or less. The thickness (T2a) of the second portion (P2) of the first layer (31a) is 0.003 μm or more and 0.3 μm or less. The thickness (T2b) of the second portion (P2) of the second layer (31b) is 0.003 or more and 0.6 μm or less. The inner wall surface 27 of the opening 26 is roughened with plasma. The inner wall surface 27 of the opening 26 is formed of the resin and the inorganic particles that form the resin insulating layer 20. A ratio (T2/T1) of the thickness (T2) of the second portion (P2) of the seed layer (30a) to the thickness (T1) of the first portion (P1) of the seed layer (30a) is 0.3 or more and 0.6 or less.

The thickness (T3) of the third portion (P3) of the seed layer (30a) on the pad 14 exposed from the opening 26 is 0.005 μm or more and 0.4 μm or less. The thickness (T3a) of the third portion (P3) of the first layer (31a) is 0.002 μm or more and 0.2 μm or less. The thickness (T3b) of the third portion (P3) of the second layer (31b) is 0.002 μm or more and 0.4 μm or less. The third portion (P3) is a connecting portion between the via conductor 40 and the pad 14. A ratio (T3/T1) of the thickness (T3) of the third portion (P3) of the seed layer (30a) to the thickness (T1) of the first portion (P1) of the seed layer (30a) is 0.25 or more and 0.40 or less.

Method for Manufacturing Printed Wiring Board

Figure 4A:
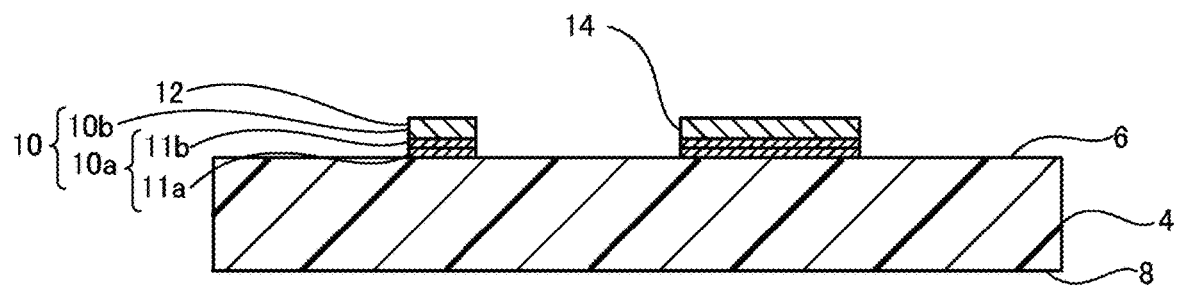
FIG. 4A is a cross-sectional view schematically illustrating a method for manufacturing a printed wiring board according to an embodiment of the present invention.

FIGS. 4A-4G illustrate a method for manufacturing the printed wiring board 1 of the embodiment. FIGS. 4A-4G are cross-sectional views. FIG. 4A illustrates the insulating layer 4 and the first conductor layer 10 formed on the third surface 6 of the insulating layer 4. The first conductor layer 10 is formed using a semi-additive method. The first layer (11a) and second layer (11b) are formed by sputtering. The electrolytic plating layer (10b) is formed by electrolytic plating.

Figure 4B:
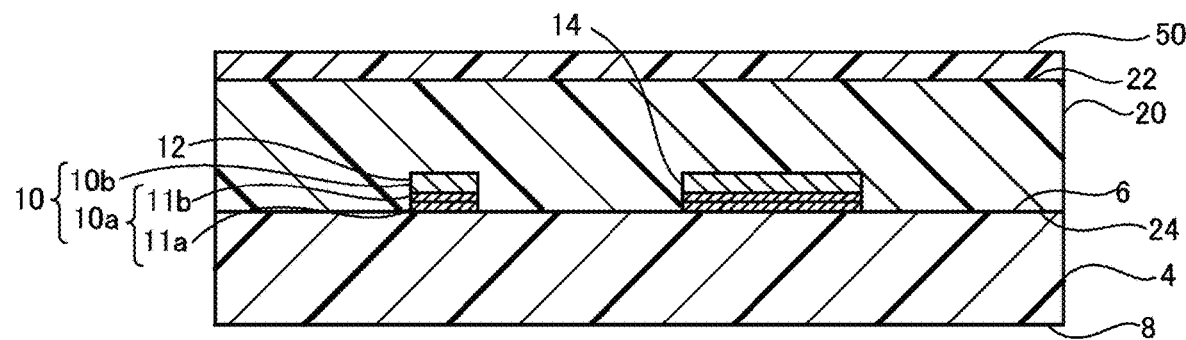
FIG. 4B is a cross-sectional view schematically illustrating a method for manufacturing a printed wiring board according to an embodiment of the present invention.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

Figure 4C:
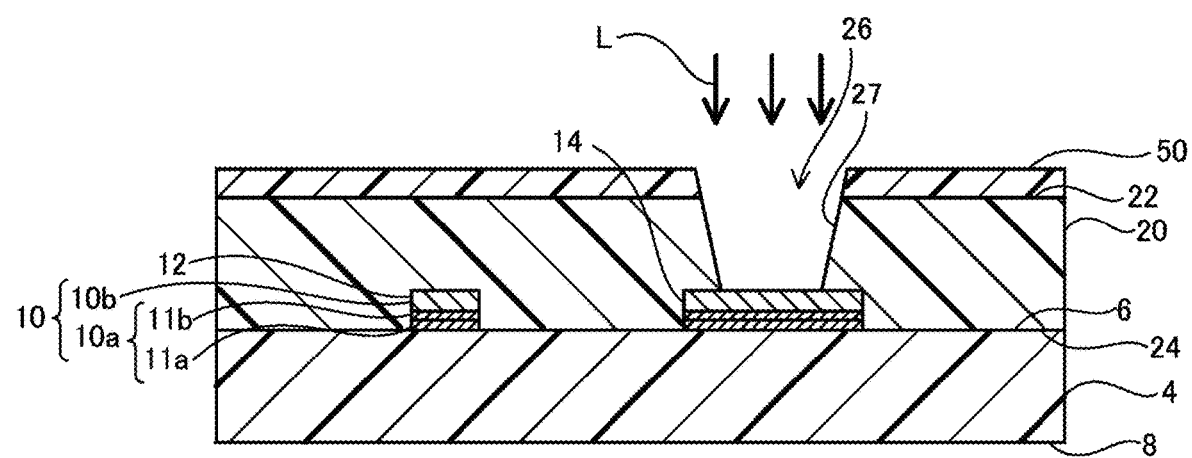
FIG. 4C is a cross-sectional view schematically illustrating a method for manufacturing a printed wiring board according to an embodiment of the present invention.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

After that, the inside of the opening 26 is cleaned. Resin residues generated when the opening 26 is formed are removed. The cleaning of the inside of the opening 26 is performed using plasma. That is, the cleaning is performed in a dry process. The cleaning includes a desmear treatment. The inner wall surface 27 of the opening 26 is roughened with plasma. The inner wall surface 27 of the opening 26 is formed of the resin and the inorganic particles that form the resin insulating layer 20. On the other hand, the first surface 22 of the resin insulating layer 20 is covered by the protective film 50. The first surface 22 is not affected by the plasma. No unevenness is formed on the first surface 22 of the resin insulating layer 20. The first surface 22 is not roughened. The first surface 22 is formed smooth.

Figure 4D:
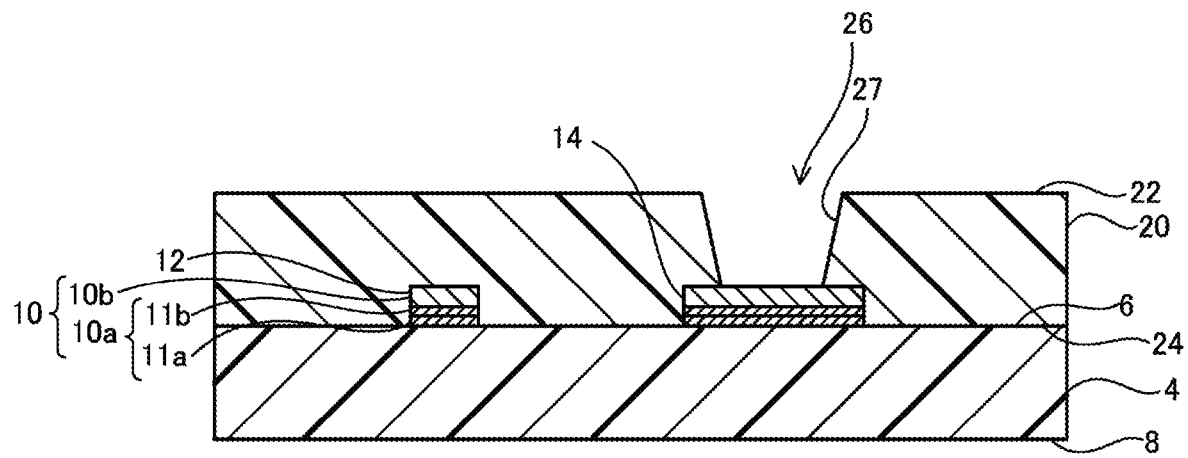
FIG. 4D is a cross-sectional view schematically illustrating a method for manufacturing a printed wiring board according to an embodiment of the present invention.

As illustrated in FIG. 4D, the protective film 50 is removed from the resin insulating layer 20. After the protective film 50 is removed, the first surface 22 of the resin insulating layer 20 is not roughened.

Figure 4E:
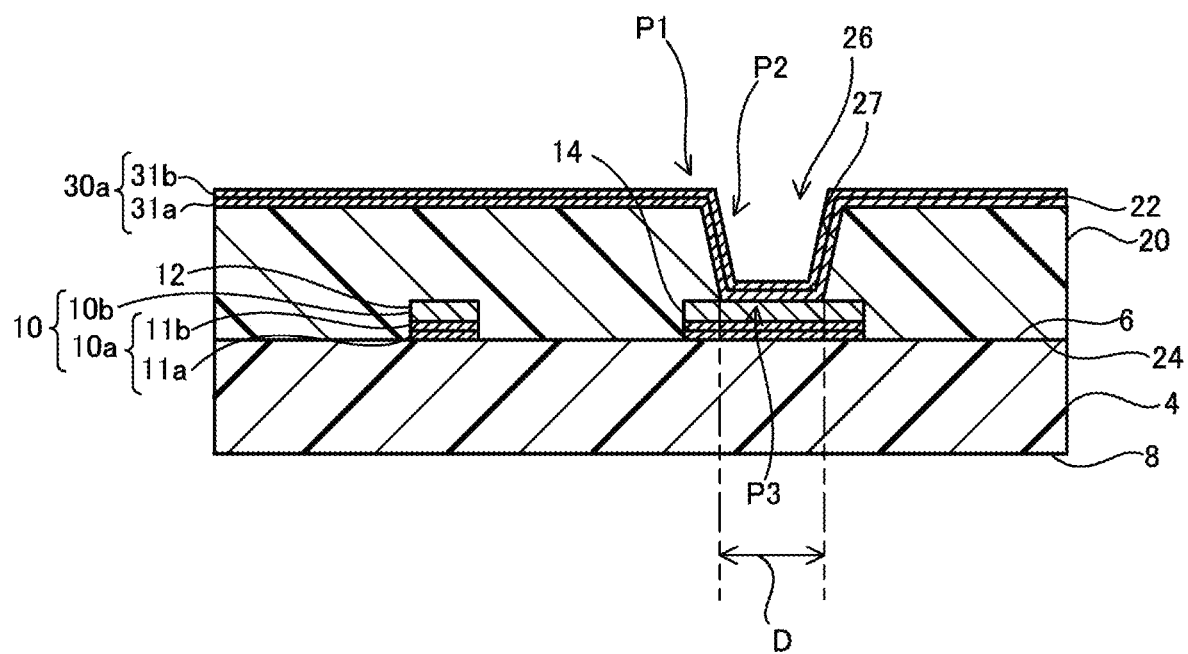
FIG. 4E is a cross-sectional view schematically illustrating a method for manufacturing a printed wiring board according to an embodiment of the present invention.

As illustrated in FIG. 4E, the seed layer (30a) is formed on the first surface 22 of the resin insulating layer 20. The seed layer (30a) is formed by sputtering. The formation of the seed layer (30a) is performed in a dry process. For example, sputtering is performed via a mask. First, a first mask covering the opening 26 for a via conductor is arranged on the resin insulating layer 20. The first mask exposes only the first surface 22 of the resin insulating layer 20. The first portion (P1) having the thickness (T1a) is formed on the first surface 22 of the resin insulating layer 20 via the first mask. The first mask is removed. A second mask exposing only the inner wall surface 27 of the opening 26 for a via conductor is arranged on the resin insulating layer 20. The second portion (P2) having the thickness (T2a) is formed on the inner wall surface 27 via the second mask. The second mask is removed. A third mask exposing only the pad 14 exposed from the opening 26 for a via conductor is arranged on the resin insulating layer 20. The third portion (P3) having the thickness (T3a) is formed on the pad 14 via the third mask. The third mask is removed. As a result, the first layer (31a) is formed on the first surface 22. The first layer (31a) is formed on the inner wall surface 27 and the pad 14, which are exposed from the opening 26. After that, the second layer (31b) is formed on the first layer (31a). A method for forming the first layer (31a) and a method for forming the second layer (31b) are the same. The first layer (31a) is formed of a copper alloy. The second layer (31b) is formed of copper.

The first layer (31a) and the second layer (31b) are formed by sputtering. Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less. For example, by changing a processing time, the thickness (T1) of the first portion (P1) of the seed layer (30a), the thickness (T2) of the second portion (P2) of the seed layer (30a), and the thickness (T3) of the third portion (P3) of the seed layer (30a) can be adjusted. The thickness (T1a) of the first portion (P1) of the first layer (31a) is larger than the thickness (T2a) of the second portion (P2) of the first layer (31a) and the thickness (T3a) of the third portion (P3) of the first layer (31a) (see FIGS. 3A-3C). Further, the thickness (T2a) of the second portion (P2) of the first layer (31a) is larger than the thickness (T3a) of the third portion (P3) of the first layer (31a). The thickness (T1b) of the first portion (P1) of the second layer (31b) is larger than the thickness (T2b) of the second portion (P2) of the second layer (31b) and the thickness (T3b) of the third portion (P3) of the second layer (31b). Further, the thickness (T2b) of the second portion (P2) of the second layer (31b) is larger than the thickness (T3b) of the third portion (P3) of the second layer (31b). As a result, the thickness (T1) of the first portion (P1) of the seed layer (30a) is larger than the thickness (T2) of the second portion (P2) and the thickness (T3) of the third portion (P3). The thickness (T2) of the second portion (P2) of the seed layer (30a) is larger than the thickness (T3) of the third portion (P3).

A ratio ((the thickness of the second layer (31b))/(the thickness of the first layer (31a))) of the thickness of the second layer (31b) to the thickness of the first layer (31a) is 1.2 or more and 2 or less. A ratio ((the thickness (T1b))/(the thickness (T1a))), a ratio ((the thickness (T2b))/(the thickness (T2a))), and a ratio ((the thickness (T3b))/(the thickness (T3a))) are 1.2 or more and 2 or less.

The first portion (P1) is formed on the first surface 22 of the resin insulating layer and the second portion (P2) is formed on the inner wall surface 27 of the resin insulating layer 20. The first portion (P1) and the second portion (P2) are both formed on the resin insulating layer 20. The first portion (P1) forms the seed layer (30a) of the land 36, first signal wiring 32, and the second signal wiring 34. The second portion (P2) forms the seed layer (30a) of the via conductor 40. A thermal expansion coefficient of the resin insulating layer 20 and a thermal expansion coefficient of the seed layer (30a) are different from each other. Therefore, it is considered that, when the printed wiring board 2 receives a thermal shock, a stress acts on the seed layer (30a). Normally, the first signal wiring 32 and the second signal wiring 34 include portions that are bent considerably longer than the via conductor 40. Therefore, large stresses concentrate on the bent portions in the first signal wiring 32 and the second signal wiring 34. In contrast, the via conductor 40 is short and formed substantially straight. Therefore, concentration of a stress is unlikely to occur in the via conductor 40. Therefore, in order to avoid breakage of the seed layer (30a) on the first surface 22 of the resin insulating layer 20, the thickness of the seed layer (30a) forming the first signal wiring 32 and the second signal wiring 34 is preferably large. In contrast, the thickness of the seed layer (30a) on the inner wall surface 27 forming the via conductor 40 may be small. Therefore, in the embodiment, the thickness (T1) is larger than the thickness (T2).

By reducing the thickness (T2) of the second portion (P2), the time required to form the seed layer (30a) can be shortened.

Figure 4F:
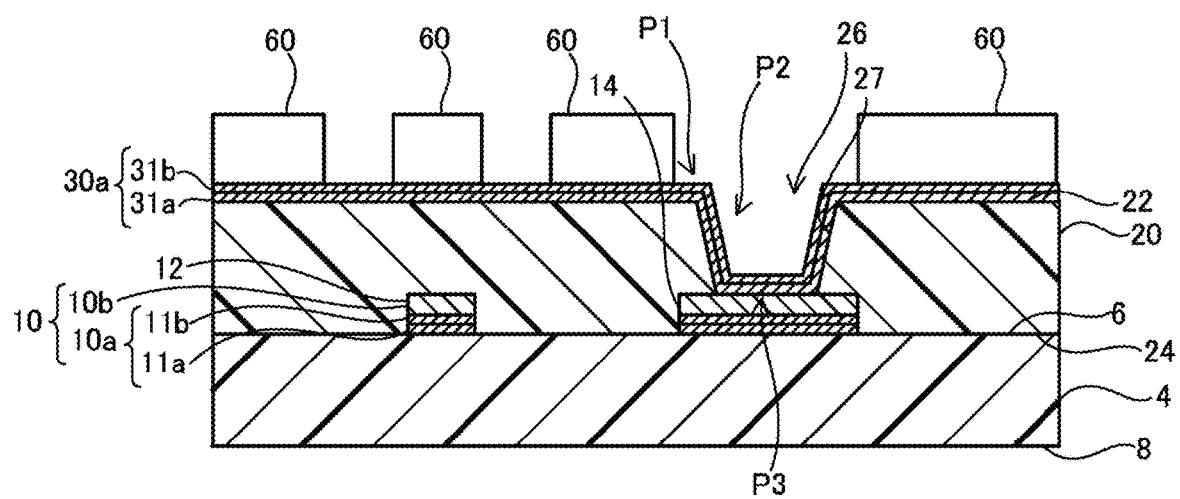
FIG. 4F is a cross-sectional view schematically illustrating a method for manufacturing a printed wiring board according to an embodiment of the present invention.

As illustrated in FIG. 4F, a plating resist 60 is formed on the seed layer (30a). The plating resist 60 has openings for forming the first signal wiring 32, the second signal wiring 34, and the land 36 (FIG. 1).

Figure 4G:
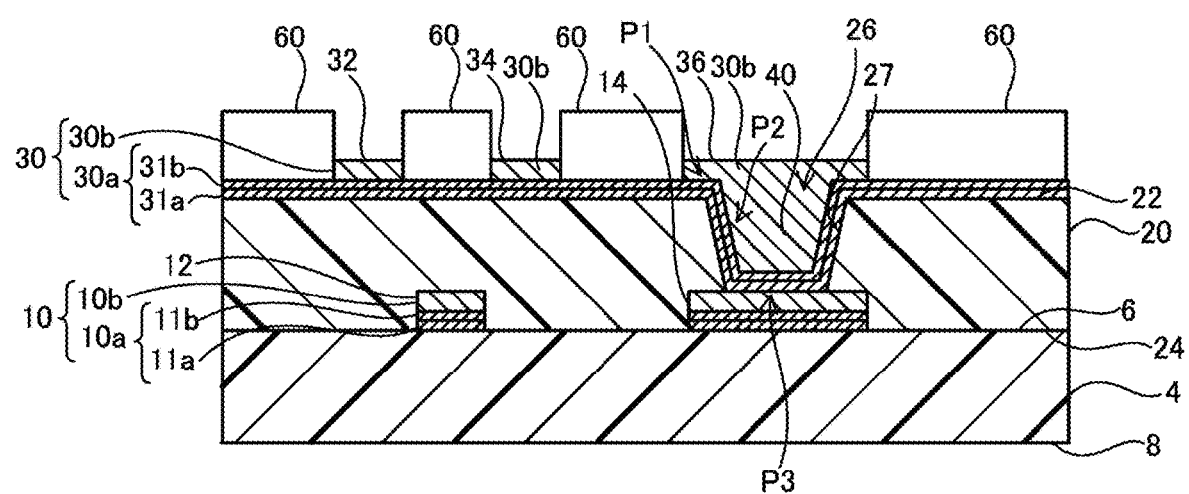
FIG. 4G is a cross-sectional view schematically illustrating a method for manufacturing a printed wiring board according to an embodiment of the present invention.

As illustrated in FIG. 4G, the electrolytic plating layer (30b) is formed on the seed layer (30a) exposed from the plating resist 60. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

When the thickness (T2) is small, a volume of the opening 26 for the via conductor after the formation of the seed layer (30a) can be increased. Therefore, an electrolytic plating solution can easily enter the opening 26. A void is unlikely to form in the electrolytic plating layer (30b) that forms the via conductor 40. A via conductor 40 having a low resistance can be formed. Even when an opening diameter (D) of the opening 26 (a diameter on the pad 14) (see FIG. 4E) is 30 μm or less, a via conductor 40 that does not contain a void can be formed. Even when the opening diameter (D) is 10 μm or more and 25 μm or less, connection reliability via the via conductor 40 is stable for a long period of time. In this way, by reducing the thickness (T2) of the second portion (P2), cost, productivity and reliability can be improved. Therefore, the thickness (T2) is preferably smaller than thickness (T1).

After that, the plating resist 60 is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

The electrolytic plating layer (10b) forming the pad 14 and the electrolytic plating layer (30b) forming the via conductor 40 sandwich the seed layer (30a) forming the third portion (P3). The seed layer (30a) is formed by sputtering. Since electrolytic plating and sputtering are different methods, it is considered that, when the printed wiring board 2 receives a thermal shock, a contraction amount or an expansion amount is different between the two. Therefore, the connection reliability via the via conductor 40 is likely to deteriorate between the seed layer (30a) and the electrolytic plating layer (10b) forming the pad 14. Or, it is likely to deteriorate between the seed layer (30a) and the electrolytic plating layer (30b) forming the via conductor 40. In order to reduce a degree of influence of the sputtered seed layer (30a) with respect to the connection reliability, the thickness of the sputtered seed layer (30a) on the pad 14 is preferably small. Therefore, in the embodiment, the thickness (T3) of the third portion (P3) is reduced. Specifically, in the embodiment, the thickness (T3) is smaller than the thickness (T1). In the embodiment, the thickness (T3) is smaller than the thickness (T2). As a result, even when the via conductor is formed of the sputtered seed layer (30a) and the electrolytic plating layer (30b), a printed wiring board 2 with high connection reliability can be provided.

According to the printed wiring board 2 (FIGS. 1 and 2) of the embodiment, the thick portion (first portion (P1)) of the seed layer (30a) is arranged on the first surface 22 of the resin insulating layer 20. Therefore, adhesion strength between the second conductor layer 30 and the resin insulating layer 20 can be increased. A printed wiring board 1 with stable performance is provided.

In the printed wiring board 2 of the embodiment, the first surface 22 of the resin insulating layer 20 is formed mostly of the resin. A small amount of the inorganic particles are exposed from the first surface 22. No unevenness is formed on the first surface 22. An increase in standard deviation of the relative permittivity in a portion near the first surface 22 of the resin insulating layer 20 is suppressed. The relative permittivity of the first surface 22 does not greatly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. Although not illustrated in the drawings, each side of the printed wiring board 2 has a length of 50 mm or more. The length of each side is preferably 100 mm or more. The length of each side is 250 mm or less. A high quality printed wiring board 2 is provided.

Another Example

In another example of the embodiment, each of the first layers (11a, 31a) of the seed layers (10a, 30a) is formed of any one metal of aluminum, titanium, nickel, chromium, calcium, magnesium, iron, molybdenum, and silver.

Japanese Patent Application Laid-Open Publication No. 2000-124602 describes a printed wiring board having a resin substrate, a resin insulating layer formed on the resin substrate, and a conductor circuit. The conductor circuit is formed on the resin insulating layer via an alloy layer containing a specific metal. For example, the specific metal is shown in paragraph 8 of Japanese Patent Application Laid-Open Publication No. 2000-124602.

In the printed wiring board having the alloy layer of Japanese Patent Application Laid-Open Publication No. 2000-124602, it is thought that the adhesion between the conductor circuit and the resin insulating layer is insufficient.

A printed wiring board according to an embodiment of the present invention includes: a first conductor layer; a resin insulating layer that is formed on the first conductor layer, and has a via conductor opening exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The second conductor layer and the via conductor are formed by a seed layer and an electrolytic plating layer formed on the seed layer. The seed layer has a first portion on the first surface, a second portion on an inner wall surface of the opening, and a third portion on the first conductor layer exposed from the opening, and the first portion is thicker than the second portion and the third portion.

According to a printed wiring board according to an embodiment of the present invention, the thick portion (first portion) of the seed layer is arranged on the first surface of the resin insulating layer. Therefore, the adhesion strength between the second conductor layer and the resin insulating layer can be increased. A printed wiring board with stable performance is obtained.

The thickness of the second portion is smaller than the thickness of the first portion. The volume of the via conductor opening after the formation of the seed layer can be increased. Even when an opening diameter of the via conductor opening is small, the via conductor opening can be filled with the electrolytic plating layer.

The first conductor layer and the via conductor are connected via the third portion. The thickness of the third portion is smaller than the thickness of the first portion. Influence of the third portion can be reduced. Connection resistance via the third portion is unlikely to increase.

Obviously, numerous modifications and variations of the present invention are possible in light of the above teachings. It is therefore to be understood that within the scope of the appended claims, the invention may be practiced otherwise than as specifically described herein.

The invention claimed is:
1. A printed wiring board, comprising:
a first conductor layer;
a resin insulating layer formed on the first conductor layer;
a second conductor layer formed on a surface of the resin insulating layer; and
a via conductor formed in an opening formed in the resin insulating layer such that the via conductor is connecting the first conductor layer and the second conductor layer,
wherein the second conductor layer and the via conductor include a seed layer and an electrolytic plating layer formed on the seed layer such that the seed layer has a first portion formed on the surface of the resin insulating layer, a second portion formed on an inner wall surface of the resin insulating layer in the opening, and a third portion formed on the first conductor layer exposed from the opening and that the first portion has a thickness that is greater than a thickness of the second portion and a thickness of the third portion, and the seed layer has a first layer and a second layer formed on the first layer such that the first portion of the first layer has a thickness that is greater than a thickness of the second portion of the first layer and a thickness of the third portion of the first layer and that the first portion of the second layer has a thickness that is greater than a thickness of the second portion of the second layer and a thickness of the third portion of the second layer.

2. The printed wiring board according to claim 1, wherein the seed layer is formed such that the second portion of the first layer has a thickness that is greater than a thickness of the third portion of the first layer and that the second portion of the second layer has a thickness that is greater than a thickness of the third portion of the second layer.

3. The printed wiring board according to claim 1, wherein the seed layer is formed such that the thickness of the first portion of the seed layer is in a range of 0.02 μm to 1.0 μm, that the thickness of the first portion of the first layer is in a range of 0.01 μm to 0.5 μm, and that the thickness of the first portion of the second layer is in a range of 0.01 μm to 0.9 μm.

4. The printed wiring board according to claim 1, wherein the seed layer is formed such that the thickness of the second portion of the seed layer is in a range of 0.006 μm to 0.6 μm, that the thickness of the second portion of the first layer is in a range of 0.003 μm 0.3 μm, and that the thickness of the second portion of the second layer is in a range of 0.003 μm to 0.6 μm.

5. The printed wiring board according to claim 1, wherein the seed layer is formed such that the thickness of the third portion of the seed layer is in a range of 0.005 μm to 0.4 μm, that the thickness of the third portion of the first layer is in a range of 0.002 μm to 0.2 μm, and that the thickness of the third portion of the second layer is in a range of 0.002 μm to 0.4 μm.

6. The printed wiring board according to claim 1, wherein the seed layer is formed such that a ratio of the thickness of the second portion to the thickness of the first portion is in a range of 0.3 to 0.6 and that a ratio of the thickness of the third portion to the thickness of the first portion is in a range of 0.25 to 0.40.

7. The printed wiring board according to claim 1, wherein the seed layer is formed by sputtering.

8. The printed wiring board according to claim 1, wherein the seed layer includes the first layer comprising a combination of a copper alloy and copper, and the second layer comprising a combination of a copper alloy and copper.

9. The printed wiring board according to claim 8, wherein the copper alloy in the first layer has a copper content of 90% or more in wt %, and the copper alloy in the second layer has a copper content of 90% or more in wt %.

10. A printed wiring board, comprising:
a first conductor layer;
a resin insulating layer formed on the first conductor layer;
a second conductor layer formed on a surface of the resin insulating layer; and
a via conductor formed in an opening formed in the resin insulating layer such that the via conductor is connecting the first conductor layer and the second conductor layer,
wherein the second conductor layer and the via conductor include a seed layer and an electrolytic plating layer formed on the seed layer such that the seed layer has a first portion formed on the surface of the resin insulating layer, a second portion formed on an inner wall surface of the resin insulating layer in the opening, and a third portion formed on the first conductor layer exposed from the opening and that the first portion has a thickness that is greater than a thickness of the second portion and a thickness of the third portion, the seed layer is formed such that the second portion has a thickness that is greater than a thickness of the third portion, and the seed layer has a first layer and a second layer formed on the first layer such that the first portion of the first layer has a thickness that is greater than a thickness of the second portion of the first layer and a thickness of the third portion of the first layer and that the first portion of the second layer has a thickness that is greater than a thickness of the second portion of the second layer and a thickness of the third portion of the second layer.

11. The printed wiring board according to claim 10, wherein the seed layer is formed such that the second portion of the first layer has a thickness that is greater than a thickness of the third portion of the first layer and that the second portion of the second layer has a thickness that is greater than a thickness of the third portion of the second layer.

12. The printed wiring board according to claim 10, wherein the seed layer is formed such that the thickness of the first portion of the seed layer is in a range of 0.02 μm to 1.0 μm, that the thickness of the first portion of the first layer is in a range of 0.01 μm to 0.5 μm, and that the thickness of the first portion of the second layer is in a range of 0.01 μm to 0.9 μm.

13. The printed wiring board according to claim 10, wherein the seed layer is formed such that the thickness of the second portion of the seed layer is in a range of 0.006 μm to 0.6 μm, that the thickness of the second portion of the first layer is in a range of 0.003 μm 0.3 μm, and that the thickness of the second portion of the second layer is in a range of 0.003 μm to 0.6 μm.

14. The printed wiring board according to claim 10, wherein the seed layer is formed such that the thickness of the third portion of the seed layer is in a range of 0.005 μm to 0.4 μm, that the thickness of the third portion of the first layer is in a range of 0.002 μm to 0.2 μm, and that the thickness of the third portion of the second layer is in a range of 0.002 μm to 0.4 μm.

15. The printed wiring board according to claim 10, wherein the seed layer is formed such that a ratio of the thickness of the second portion to the thickness of the first portion is in a range of 0.3 to 0.6 and that a ratio of the thickness of the third portion to the thickness of the first portion is in a range of 0.25 to 0.40.

16. The printed wiring board according to claim 2, wherein the seed layer includes the first layer comprising a combination of a copper alloy and copper, and the second layer comprising a combination of a copper alloy and copper.

17. The printed wiring board according to claim 16, wherein the copper alloy in the first layer has a copper content of 90% or more in wt %, and the copper alloy in the second layer has a copper content of 90% or more in wt %.

18. The printed wiring board according to claim 10, wherein the seed layer is formed such that a material of the first layer and a material of the second layer are a combination of a copper alloy and copper.

19. The printed wiring board according to claim 18, wherein the copper alloy in the first layer has a copper content of 90% or more in wt %, and the copper alloy in the second layer has a copper content of 90% or more in wt %.

20. The printed wiring board according to claim 11, wherein the seed layer is formed such that a material of the first layer and a material of the second layer are a combination of a copper alloy and copper.

* * * * *